United States Patent [19]

Tamagawa et al.

[11] Patent Number: 4,902,600

[45] Date of Patent: * Feb. 20, 1990

[54] LIGHT-SENSITIVE MATERIAL COMPRISING LIGHT-SENSITIVE LAYER PROVIDED ON SUPPORT WHEREIN THE LIGHT-SENSITIVE LAYER AND SUPPORT HAVE SPECIFIED PH VALUES

[75] Inventors: Shigehisa Tamagawa, Shizuoka; Masayuki Kuroishi, Kanagawa, both of Japan

[73] Assignee: Fuji Photo Film Co., Ltd., Kanagawa, Japan

[*] Notice: The portion of the term of this patent subsequent to Aug. 1, 2006 has been disclaimed.

[21] Appl. No.: 230,290

[22] Filed: Aug. 9, 1988

Related U.S. Application Data

[63] Continuation-in-part of Ser. No. 108,235, Oct. 14, 1987, abandoned.

[30] Foreign Application Priority Data

Oct. 14, 1986 [JP] Japan ................................. 61-243552

[51] Int. Cl.$^4$ ........................... G03C 1/72; G03C 1/86
[52] U.S. Cl. ..................................... 430/138; 430/203; 430/270; 430/281; 430/538; 430/939
[58] Field of Search ............... 470/138, 538, 203, 212, 470/213, 253, 254, 270, 281, 939

[56] References Cited

U.S. PATENT DOCUMENTS

| | | | |
|---|---|---|---|
| 3,694,252 | 9/1972 | Gerber et al. | 430/138 |
| 3,694,253 | 9/1972 | Gerber et al. | 430/138 |
| 3,767,400 | 10/1973 | Hayakawa et al. | 430/199 |
| 4,255,491 | 3/1981 | Igarashi | 428/537 |
| 4,265,978 | 5/1981 | Morishita et al. | 428/537 |
| 4,335,184 | 6/1982 | Miyamoto et al. | 428/342 |
| 4,482,628 | 11/1984 | Katsura et al. | 430/538 |
| 4,624,910 | 11/1986 | Takeoa | 430/203 |
| 4,629,676 | 12/1986 | Hayakawa et al. | 430/203 |
| 4,649,098 | 3/1987 | Takeda | 430/270 |
| 4,682,191 | 7/1987 | Tamagawa et al. | 503/200 |
| 4,775,656 | 10/1988 | Harada et al. | 503/221 |

FOREIGN PATENT DOCUMENTS

| | | | |
|---|---|---|---|
| 203613 | 12/1986 | European Pat. Off. | 430/138 |
| 6645 | 2/1977 | Japan . | |

OTHER PUBLICATIONS

Japanese Patent Publication No. 52(1977)-6645, JIS P8133, 1976, "Testing Method for pH of Paper and Paperboard".

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive material comprises a paper support and a light-sensitive layer containing silver halide grains, a reducing agent and an ethylenic unsaturated polymerizable compound. The silver halide grains and polymerizable compound are contained in microcapsules which are dispersed in the light-sensitive layer. The light-sensitive layer has a pH value of not higher than 8. The paper support has a pH value of from 5 to 9. An image-forming method employing the light-sensitive material is also disclosed.

8 Claims, No Drawings

LIGHT-SENSITIVE MATERIAL COMPRISING LIGHT-SENSITIVE LAYER PROVIDED ON SUPPORT WHEREIN THE LIGHT-SENSITIVE LAYER AND SUPPORT HAVE SPECIFIED PH VALUES

CROSS-REFERENCE TO RELATED APPLICATION

This is a continuation-in-part application of U.S. patent application Ser. No. 07/108,235 filed on Oct. 14, 1987 now abandoned.

FIELD OF THE INVENTION

This invention relates to a light-sensitive material comprising a light-sensitive layer containing silver halide, a reducing agent and a polymerizable compound provided on a support.

BACKGROUND OF THE INVENTION

A light-sensitive material comprises a light-sensitive layer containing silver halide, a reducing agent and a polymerizable compound provided on a support. The light-sensitive material can be used in an image forming method comprises steps of imagewise exposing the light-sensitive material to form a latent image of the silver halide, and polymerizing the polymerizable compound to form an image corresponding to the latent image.

Japanese Patent Publications No. 45(1970)-11149 (corresponding to U.S. Pat. No. 3,697,275), No. 47(1972)-20741 (corresponding to U.S. Pat. No. 3,687,667) and No. 49(1974)-10697, and Japanese Patent Provisional Publications No. 57(1982)-138632, No. 57(1982)-142638, No. 57(1982)-176033, No. 57(1982)-211146 (corresponding to U.S. Pat. No. 4,557,997), No. 58(1983)-107529 (corresponding to U.S. Pat. No. 4,560,637), No. 58(1983)-121031 (corresponding to U.S. Pat. No. 4,547,450) and No. 58(1983)-169143 describe an image forming method comprises steps of developing the exposed silver halide by a developing solution, and polymerizing the polymerizable compound in the presence of a reducing agent (which is oxidized) to form a polymer image. Thus, the method needs a wet development process employing the developing solution. Therefore, the process takes a relatively long time for the operation.

Japanese Patent Provisional Publications No. 61(1986)-69062 and No. 61(1986)-73145 (the contents of both publications are described in U.S. Pat. No. 4,629,676 and European Patent Provisional Publication No. 0174634A2) describe an improved image forming method employing a dry process. The image forming method comprises steps of imagewise exposing a recording material (i.e., light-sensitive material) comprising a light-sensitive layer containing a light-sensitive silver salt (i.e., silver halide), a reducing agent, a polymerizable compound having at least one carbon-carbon unsaturated bond and a binder provided on a support to form a latent image, and heating the recording material to polymerize the polymerizable compound within the area where the latent image of the silver halide has been formed. The method employing the dry process is also described in Japanese Patent Provisional Publications No. 61(1986)-183640, No. 61(1986)-188535 and No. 61(1986)-228441 (the content of these three publications are described in U.S. patent application Ser. No. 827,702).

The above-mentioned image forming methods are based on the principle in which the polymerizable compound is polymerized within the area where a latent image of the silver halide has been formed.

Further, Japanese Patent Provisional Publications No. 61(1986)-243449 and No. 61(1986)-260241 describes another image-forming method in which the polymerizable compound within the area where a latent image of the silver halide has not been formed is polymerized. In this method, the reducing agent functions as a polymerization inhibitor within the area where a latent image of the silver halide has been formed. Accordingly, the polymerizable compound within the other area is polymerized when the light-sensitive material is heated.

Japanese Patent Provisional Publications No. 61(1986)-275742 and No. 61(1986)-278849 (the contents of both publications are described in U.S. patent application Ser. No. 868,385 and European Patent Provisional Publication No. 0203613A) describe an embodiment of the light-sensitive material, which employs microcapsules containing components of the light-sensitive layer, such as silver halide and a polymerizable compound.

As the support for the light-sensitive material, a paper is sometimes employed, because a paper is disposable, lightweight and easy to handle.

SUMMARY OF THE INVENTION

According to study of the present inventors, a paper support sometimes shows some unfavorable behaviors in the image forming method. In more detail, the sensitivity of the light-sensitive material employing a paper support is relatively low, as compared with that employing other material as the support such as polyethylene terephthalate film. Further, it is observed that the sharpness of the obtained image is also relatively low when the paper support is employed.

The present inventors have discovered that a cause of the above-mentioned unfavorable behaviors is attributed to a pH value of the paper support. The pH value of the paper support so far has been not higher than 5, because such an acid paper is most conventional.

In respect of preservation, it is described that the light-sensitive layer preferably has a pH value of not higher than 7 in Japanese Patent Application No. 61(1986)-104226 (corresponding to copending U.S. patent application Ser. No. 046,360). On the other hand, for the purpose of a smooth progress of the development, the light-sensitive layer preferably has a pH value of higher than 7, and more preferably not lower than 9. As a result, the pH value of the light-sensitive layer of the light-sensitive material is usually increased at the time of development or just in advance of the time of development in an appropriate way. The inventors have further discovered that the pH value of the light-sensitive layer is not sufficiently increased, if the paper support employed has a pH value of not higher than 5. This is a cause of the above-mentioned unfavorable behaviors of the paper support.

An object of the present invention is to provide a light-sensitive material employing a paper support which has a high sensitivity and gives an improved clear image.

Another object of the invention is to provide a light-sensitive material which is improved in the preservability.

There is provided by the present invention a light-sensitive material comprising a paper support and a light-sensitive layer containing silver halide grains, a reducing agent and an ethylenic unsaturated polymerizable compound, said silver halide grains and polymerizable compound being contained in microcapsules which are dispersed in the light-sensitive layer, wherein the light-sensitive layer has a pH value of not higher than 8 and the paper support has a pH value of from 5 to 9.

The light-sensitive material of the present invention is easy to enhance the pH value of the light-sensitive layer in the development process, because the pH value of the paper support employed in the light-sensitive material is not lower than 5. The polymerization reaction thus proceeds smoothly within the area where a latent image of the silver halide has been formed (or has not been formed). Therefore, the light-sensitive material of the invention has a high sensitivity and gives an improved clear image.

On the other hand, the pH value of the light-sensitive material is scarcely increased by the influence of the paper support, because the pH value of the paper support is not so high. Therefore, the light-sensitive material of the invention can give an improved clear image, even if the material is preserved for a long term or under severe conditions.

DETAILED DESCRIPTION OF THE INVENTION

The paper support of the light-sensitive material of the invention has a pH value of from 5 to 9. The paper support more preferably has a pH value of from 6 to 8.5.

In the present invention, the pH value of the paper support means a value which is measured according to a hot water extracting method. The hot water extracting method is defined in JIS(Japanese Industrial Standard)-P-8113 (1976). The method comprises following process.

Measuring approx. 1 g of test piece, it is put in a triangular flask having the capacity of 100 ml. In the flask is added 20 ml of distilled water, and the test piece is immersed in the distilled water with a flat tipped rod until it uniformly gets wet to be soft. Further, 50 ml of distilled water is added. It is mixed and a cooling tube is connected to the flask. The flask is placed in a hot bath in which the content in the flask may be maintained at 95° to 100° C. without boiling water. Shaking the flask from time to time at this temperature, it is heated for an hour and then cooled to 20° C.±5 deg. Then, the pH of the extract is measured using a glass electrode of a pH meter.

Testing method and apparatus for the hot water extracting method are described in more detail in Specification of Japanese Industrial Standard (JIS-P-8113, 1976).

The constitution of the paper support of the present invention and the means of adjusting the pH value of the paper support in a range of 5 to 9 are described below.

The base paper used for the paper support is mainly composed of wood pulp. As the wood pulp, any of softwood pulp and hardwood pulp can be used. However, hardwood pulp is more preferred, because it is mainly composed of short fibers, which are convenient for increasing the BekK Smoothness of the paper. In more detail, hardwood pulp is preferably used in an amount of not less than 60 weight % based on the total amount of pulp contained in the base paper.

The wood pulp can be partially replaced with a synthetic pulp composed of polyethylene, polypropylene or the like, or a synthetic fiber composed of a polyester, polyvinyl alcohol, nylon or the like.

The Canadian standard freeness (CSF) of wood pulp as a whole preferably ranges from 250 to 500 cc, and more preferably from 300 to 450 cc. After having been beaten, the pulp preferably has such a distribution of fiber length that an amount of residual pulp on 24 mesh screen and on 42 mesh screen is not more than 40 weight % based on the total amount of pulp. The method for the determination of the fiber length distribution is defined in JIS-P-8207.

In preparation of a conventional paper, an internal size is usually added to paper stuff. In the present invention the internal size preferably is a neutral material to adjust the pH value of the paper support in a range of 5 to 9. Examples of the neutral internal size include a fatty acid anhydride, a rosin acid anhydride, an alkenylsuccinic anhydride, a succinamide, isopropenyl stearate, aziridine, an aziridine derivative and an alkylketene dimer.

In preparation of a conventional paper, a fixing agent for the internal size is usually added to paper stuff. In the present invention a neutral or weak alkaline compound is preferably used as the fixing agent in place of the conventional acidic fixing agent (e.g., alminium sulfate) to adjust the pH value of the paper support. Examples of the neutral or weak alkaline fixing agent include a cationic starch, polyamide-polyamine-epichlorohydrin, polyacrylamide and a polyacrylamide derivative.

A filler can be added to the base paper to increase the smoothness. Examples of the filler include calcium carbonate, talc, clay, kaolin, titanium dioxide and fine particles of urea resin.

A paper strengthening agent (e.g., polyacrylamide, starch, polyvinyl alcohol), a softening agent (e.g., a reaction product of a maleic anhydride copolymer with a polyalkylene polyamine, a quarternary ammonium salt of a higher fatty acid), a colored dye and/or a fluorescent dye can be added to the base paper in addition to the internal size, the fixing agent and the filler. Among these additives, a nearly neutral material is also preferably selected to be added to the base paper in order to adjust the pH value of the paper support in a range of 5 to 9. Further, an acidic or alkaline material is preferably used as little as possible.

The base paper can be prepared by Fourdrinier paper machine or Cylinder paper machine. The base paper preferably has a basis weight of 20 g/m$^2$ to 200 g/m$^2$, and more preferably 30 g/m$^2$ to 100 g/m$^2$. The thickness of the base paper preferably ranges from 25 to 250 μm, and more preferably from 40 to 150 μm.

The base paper can be passed through a calender such as on-machine calender in a paper machine or supercalender outside a paper machine to improve the smoothness. After having been calendered, the density (bulk density) of the base paper preferably ranges from 0.7 to 1.2 g/m$^2$, and more preferably from 0.85 to 1.10 g/m$^2$, wherein the value is measured according to JIS-P-8118.

The pH value of the base paper can be adjusted in a range of 5 to 9 by various means such as selecting the internal size and the fixing agent in the course of the above-stated process.

The base paper itself can be used as a paper support of the light-sensitive material of the invention. A surface size can be coated on the surface of the base paper.

Examples of the surface size include polyvinyl alcohol, starch, polyacrylamide, gelatin, casein, styrene-maleic anhydride copolymer, alkylketene dimer, polyurethane and an epoxidized fatty acid amide.

A coating layer can be provided on the one side or both sides of the base paper (including the base paper on which surface size is coated). There is no specific limitation with respect to composition of the coating layer. A hydrophobic polymer is preferably contained in the coating layer to reduce water absorptiveness of the paper support. The water absorption of the paper support from a coating solution of a light-sensitive layer causes a distortion or deformation of the light-sensitive material. Therefore, the surface of the paper support on which the light-sensitive layer is provided preferably has a low water absorptiveness of not more than 3 g/m$^2$ which is a value measured according to Cobb test method.

The hydrophobic polymer can be a homopolymer or a copolymer. The copolymer may partially contain a hydrophilic repeating unit, so long as it is hydrophobic as a whole. Examples of the hydrophobic polymers include polyvinylidene chloride, styrene-butadiene copolymer, methyl methacrylate-butadiene copolymer, acrylonitrile-butadiene copolymer, styrene-acrylate copolymer, methyl methacrylate-acrylate copolymer and styrene-methacrylate-acrylate copolymer.

The hydrophobic polymer preferably has a cross-linked structure. The cross-linked structure can be introduced into the hydrophobic polymer when a conventional hardening agent (crosslinking agent) is used together with the hydrophobic polymer in the course of the preparation of the paper support. Examples of the hardening agents include an active vinyl compound (e.g., 1,3-bis(vinylsulfonyl)-2-propanol, methylenebis-maleimide), an active halogen compound (e.g., sodium salt of 2,4-dichloro-6-hydroxy-S-triazine, 2,4-dichloro-6-hydroxy-S-triazine, N,N'-bis(2-chloroethylcarbamyl)-piperazine), an epoxy compound (e.g., bis(2,3-epoxypropyl)methylpropylammonium p-toluenesulfonate), and a methanesulfonate compound (e.g., 1,2-di(methane-sulfonoxy)ethane).

A pigment can be added to the coating layer to increase the smoothness of the surface of the coating layer and to facilitate the formation of the coating layer in the course of preparation. The pigment may be any of inorganic and organic pigments employed in the conventional coated paper (coat paper, art paper, baryta paper etc.). Examples of the inorganic pigments include titanium dioxide, barium sulfate, talc, clay, kaolin, calcined kaolin, aluminum hydroxide, amorphous silica and crystalline silica. Examples of the organic pigments include polystyrene resin, acrylic resin, urea-formaldehyde resin.

A waterproofing agent can be also added to the coating layer. Examples of the waterproofing agents include polyamide-polyamine-epichlorohydrin resin, polyamide-polyurea resin, glyoxal resin, etc. Resins containing no formaldehyde (e.g., polyamide-polyamine-epichlorohydrin resin and polyamide-polyurea resin) are particularly preferred.

The coating layer can be prepared by coating a solution on the surface of the base paper. A latex in which the components such as the hydrophobic polymer, hardening agent, pigment and/or waterproofing agent are dissolved, dispersed or emulsified can be used as the coating solution. The coating solution can be coated on the base paper according to any of the conventional coating methods such as dip coating method, air-knife coating method, curtain coating method, roller coating method, doctor coating method, gravure coating method, etc.

The coating layer is preferably provided on the base paper in a coating weight of 1 to 30 g/m$^2$, and more preferably 5 to 20 g/m$^2$.

The paper support can be passed through a calender such as gloss calender or supercalender to increase the smoothness of the paper support simultaneously with or after coating the layer on the base paper.

The light-sensitive material of the present invention comprises a light-sensitive layer having a pH value of not higher than 8 on the above-mentioned paper support. The light-sensitive layer preferably has a pH value of not higher than 7.5, and more preferably has a pH value of not higher than 7.

Further, in the light-sensitive material of the present invention, the silver halide grains and polymerizable compound are contained in microcapsules which are dispersed in the light-sensitive layer. In the case that the light-sensensitive layer contains the microcapsules, the reducing agent has remarkably deteriorated when the light-sensitive layer has a pH value of higher than 8. The detrioration of the reducing agent is observed whether the reducing agent is contained in the microcapsule, arranged outside of the microcapsule, or contained in the shell material of the microcapsule.

The pH value of the light-sensitive layer preferably is higher than 9 in a development process. When the pH value of the light-sensitive layer is too low, it is difficult to process or to construct the light-sensitive material for raising the pH value of the light-sensitive layer. Further, the preservability of the light-sensitive material is not so improved as expected, when the pH value is lower than 5. Therefore, the light-sensitive layer preferably has a pH value of not lower than 5.

In the present invention, the pH value of the light-sensitive layer means a value obtained by a process comprising: dropping distilled water on the light-sensitive layer; placing a glass electrode of a pH meter on the area wetted by the distilled water on the light-sensitive layer to connect the glass electrode with the layer via water; and measuring the value after lapse of 30 seconds.

There is no specific limitation with respect to the preparation of the light-sensitive layer having the pH value of not higher than 8. The pH value of the light-sensitive layer is easily and preferably adjusted at the stage of the coating solution of the light-sensitive layer in the process for the preparation of the light-sensitive material. For instance, an acid is added to the coating solution for lowering the pH value of the solution. There is also no specific limitation with respect to the acid, and either an inorganic acid, an organic acid or an acidic salt can be employed. Among these acids, an acid such as sulfuric acid or nitric acid which is unreactive to silver for the formation of a complex salt is preferred. Further, an acid having such a property that it can be vaporized or decomposed in the development process is also preferred. For example, in the case that heat development is utilized for developing the light-sensitive material, an acid such as acetic acid which is vaporized or decomposed when it is heated (generally at 80° to 200° C.) can be used. These acids can be used singly or in combination.

The light-sensitive material of the present invention is constructed to sufficiently enhance the pH value of the light-sensitive layer in the development process. Therefore, a base (inorganic base or organic base) is preferably added to the light-sensitive layer in an image-forming method simultaneously with or prior to the development process. Alternatively, the light-sensitive material of the invention is preferably so constructed that the base is produced or dispersed in the light-sensitive layer in the development process.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxyalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

Various means can be employed for adding the base in the light-sensitive layer. Where the development is conducted using a developing solution in the same manner as the image-forming method described in Japanese Patent Publication No. 45(1970)-11149 (corresponding to U.S. Pat. No. 3,697,275), a base can be previously contained in the developing solution.

Where the development is heat development in the same manner as the image-forming method described in Japanese Patent Provisional Publication No. 61(1986)-69062 (corresponding to U.S. Pat. No. 4,629,676 and European Patent Provisional Publication No. 0174634A2), a base or a base precursor can be added to the light-sensitive layer simultaneously with or prior to the development process. Various means can be employed for adding the base or the base precursor to the light-sensitive layer, for example, coating a solution of the base on the light-sensitive layer, immersing the light-sensitive material in the solution of the base, or placing the material on another sheet containing the base. Among these means, the sheet containing the base is preferably employed.

In the case that the light-sensitive material is constracted to produce the base in the light-sensitive layer in the development process, a base precursor can be employed instead of the base. In the light-sensitive material containing a base precursor, the pH value of the light-sensitive layer can rise by itself in the development process without keeping the base precursor from the components of the light-sensitive layer. The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate and 4-acetylaminomethyl propionate.

In the case that the light-sensitive material is constracted to disperse the base into the light-sensitive layer in the development process, the base or base precursor is preferably arranged outside of the light-sensitive microcapsules containing the silver halide grains and polymerizable compound.

For example, in the light-sensitive material the base or base precursor can be contained in other microcapsules than the light-sensitive microcapsules. The shell of the microcapsule containing the base or base precursor is preferably composed of a thermal plastic material having a melting point or softening point in a range of 50° to 200° C., in the case that a heat development is utilized for developing the light-sensitive material. The base or base precursor can be contained in the microcapsules under condition that the base or base precursor is dissolved or dispersed in an aqueous solution of a water retention agent, or under condition that the base or base precursor is adsorbed on solid particles.

Further, the base or base precursor can be simply arranged outside of the light-sensitive microcapsules containing the silver halide grains and polymerizable compound. In this case, the base or base precursor preferably is a hydrophobic compound having melting point of 80° to 180° C. in the form of solid particles.

Furthermore, the base or base precursor can be contained in a different layer from the light-sensitive layer. In this case, a barrier layer is preferably provided between the light-sensitive layer and the layer containing the base or base precursor. The barrier layer has a function of keeping the base or base precursor from the light-sensitive layer and, when heated, allowing transmission of the base or base precursor therethrough.

These bases or base precursors are preferably used in an amount of not more than 50% by weight, and more preferably from 0.01 to 40% by weight, based on the total solid content of the light-sensitive layer. These bases or base precursors can be used singly or in combination.

The silver halide grains, the reducing agent, the polymerizable compound which constitute the light-sensitive layer provided on the support are described below. Thus composed material is referred hereinafter to as "light-sensitive material".

There is no specific limitation with respect to silver halide grains contained in the light-sensitive layer. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. A silver halide grain can have a core/shell structure in which the silver iodide content in the shell is higher than that in the core. There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination. There is also no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 0.1 g/m², more preferably in the range of from 1 mg to 90 mg/m².

There is no specific limitation with respect to the polymerizable compound, except that the polymerizable compound has an ethylenic unsaturated group. Any known ethylenic unsaturated polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The silver halide and polymerizable compound are contained in the microcapsules which are dispersed in the light-sensitive layer. There is no specific limitation on the microcapsules, and various known manners can be employed. The reducing agent and the other optional component can be contained in the microcapsules or arranged outside of the microcapsules in the light-sensitive layer. Generally, the reducing agent is preferably contained in the microcapsule, because the reaction can progress smoothly in such case. The reducing agent is more preferably dispersed or dissolved in the core material of the microcapsules. In the case that the heat development is utilized in the use of the light-sensitive material, there is no problem in arranging the reducing agent outside of the microcapsule, because the reducing agent can permeate the microcapsule to reach the core material.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm. In the light-sensitive material of the invention, the mean grain size of the silver halide grains preferably is not more than the 5th part of the mean size of the microcapsules, more preferably is not more than the 10th part. It is observed that when the mean size of the microcapsules is not less than 5 times as much as the mean grain size of silver halide grains, even and uniform image can be obtained. It is preferred that at least 70 weight % (more preferably 90 weight %) of the silver halide is embedded in the shell material of the microcapsules.

Further, two or more kinds of the microcapsules differing from each other with respect to at least one of the silver halide and the polymerizable compound can be employed. Furthermore, three or more kinds of the microcapsules differing from each other with respect to the color image formation substance is preferably employed to form a full color image.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. For example, when a hydrazine derivative is used as the reducing agent, the polymerizable compound within the area where the latent image has been formed is polymerized. Further, when 1-phenyl-3-pyrazolidone is used as the reducing agent, the polymerizable compound within the area where the latent image has not been formed is polymerized.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (Jun. 1978), and Research Disclosure No. 17643, pp. 22–31 (Dec. 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl} phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator and solvent of the polymerizable compound.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (Jun. 19, 1980).

In the case that the color image forming substance comprising two components (e.g., a color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors (these three accelerators have been previously described), oils, surface active agents, compounds functioning as an anti-fogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having—$SO_2$—and/or—$CO$—group described in U.S. Pat. No. 3,347,675; polar compounds described in U.S. Pat. No. 3,667,959; and 1,10-decanediol, methyl anisate and biphenyl suberate described in Research Disclosure 26-28 (Dec. 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development.

The antismudging agents employable in the light-sensitive material preferably are particles which are solid at ambient temperatures. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. The light-sensitive material employing a binder is described in Japanese Patent Provisional Publication No. 61(1986)-69062 (corresponding to U.S. Pat. No. 4,629,676 and European Patent Provisional Publication No. 0174634A2).

The photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, 9–15 (Jun. 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain a coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be used.

In the preparation of the silver halide emulsions, hydrophilic colloids (e.g., gelatin) are advantageously used as protective colloids to improve the sensitivity of the light-sensitive material. In the formation of silver halide grains in the silver halide emulsion, ammonia, an organic thioether derivative or sulfur-containing compound can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

Where the sensitizing dyes are added to the silver halide emulsion, the sensitizing dye is preferably added during the preparation of the emulsion. Where the 5- or 6- membered nitrogen containing heterocyclic compounds are added to the silver halide emulsion as an antifogging agent and/or a development accelerator, the compounds are preferably added during the grain formation or the ripening of the emulsion.

Where the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion, the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Further, optional components, such as the reducing agents, the color image forming substances may dissolved, emulsified or dispersed in the light-sensitive composition. Furthermore, the necessary components for preparation of the microcapsule, such as shell wall-forming materials can be incorporated into in the light-sensitive composition.

The light-sensitive composition are preferably emulsified in an aqueous medium to prepare the microcapsule in the invention. The necessary components for preparation of the microcapsule, such as shell materials can be incorporated into the emulsion. Further, other components such as the reducing agent can be added to the emulsion.

The emulsion of the light-sensitive composition is then processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

In the above-mentioned process, an aqueous dispersion of the microcapsules can be obtained. The dispersion of the microcapsules can be used as the coating solution of the light-sensitive layer. The coating solution of the light-sensitive layer can be adjusted with an acid to form the layer having a pH value of not higher than 8. The pH value of the light-sensitive layer can be easily adjusted in the stage of the coating solution, because a strong correlation between the pH values of the coating solution and the light-sensitive layer is generally valid even if there is a difference between these pH values.

The light-sensitive material of the invention can be prepared by coating and drying the dispersion of the microcapsules on a support in the conventional manner.

The light-sensitive material of the invention can be prepared by coating and drying the coating solution on a support in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149 (corresponding to U.S. Pat. No. 3,697,275). The image forming method described in Japanese Patent Provisional Publication No. 61(1986)-69062 (corresponding to U.S. Pat. No. 4,629,676 and European Patent Provisional Publication No. 0174634A2) which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. The heating temperature for the development process usually ranges from 80° C. to 200° C., and preferably from 100° C. to 160° C. Various heating patterns are applicable. The heating time is usually not shorter than 1 second, and preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

In the above development process, a polymer image can be formed on the light-sensitive layer. A pigment image can be also obtained by fixing pigments to the polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be used as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer.

After the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of paper support

In a disk refiner, 80 weight parts of a laubholz bleached kraft pulp (LBKP) and 20 weight parts of a nadelholz bleached kraft pulp (NBKP) were beaten to give a pulp having a Canadian standard freeness of 320 cc. To the obtained pulp were added 0.4 weight part of an alkylketene dimer (Aquapel 12, trademark of DIC-HERCULES CO., Ltd.) as a neutral size and 0.3 weight part of polyamidepolyamine-epichlorohydrin (Kymene 557, trademark of DIC-HERCULES Co., Ltd.) as a fixing agent to obtain a paper stuff, in which the part was a dry weight ratio to the pulp. A base paper having a basis weight of 40 g/m$^2$ and a thickness of 50 μm was prepared from the obtained paper stuff using a Fourdrinier paper machine.

The obtained base paper was per se used as a paper support (a).

The pH value of the paper support was measured according to the hot water extracting method defined in JIS-P-8133. The pH value of the paper support (a) was 6.2.

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a,7-tetrazaindene at 60° C. Yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 min. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of light-sensitive composition

In 100 g of trimethylolpropane triacrylate were dissolved 0.40 g of the following copolymer, 6.00 g of Pargascript Red I-6-B (tradename of Ciba-Geigy) and 2 g of Emulex NP-8 (tradename of Nippon Emulsion Co., Ltd.).

(Copolymer)

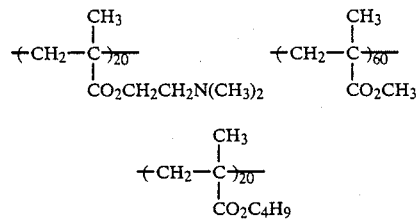

In 18.00 g of the solution was dissolved 0.002 g of the following thiol derivative.

(Thio derivative)

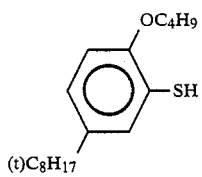

To the resulting solution was added a solution in which 0.16 g of the following reducing agent (I) and 1.22 g of the following reducing agent (II) are dissolved in 1.80 g of methylene chloride.

(Reducing agent (I))

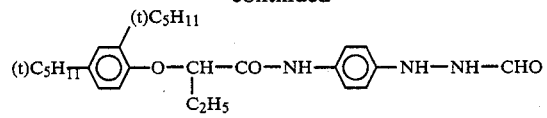

(Reducing agent (II))

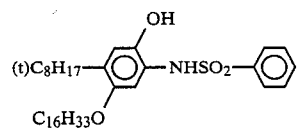

To the resulting solution were added 3.50 g of the silver halide emulsion and 3.35 g of the silver benzotriazole emulsion, and the mixture was stirred at 15,000 r.p.m. for 5 minutes to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde and 3.00 g of 8.00% aqueous solution of ammonium sulfate in this order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=50/50 as volume ratio) of guanidine trichroloacetate to prepare a coating solution.

(Anionic surfactant)

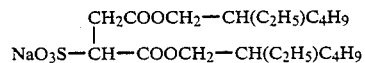

The coating solution was uniformly coated on the right side of the paper support (a) using a coating rod of #40 to give a layer having a wet thickness of 70 μm and dried at about 40° C. to obtain a light-sensitive material (A-1).

The pH value of the light-sensitive layer was 7.0, wherein the value was measured by the process comprising: dropwise adding distilled water on the light-sensitive layer; applying Horiba Flat Glass Electrode (tradename of Horiba Seisakusho Co., Ltd.) on the area wetted by distilled water in the light-sensitive layer to connect the glass electrode with the layer via water; and measuring the value after 30 seconds by Horiba pH meter F-7AD (tradename of Horiba Seisakusho Co., Ltd.).

EXAMPLE 2

Preparation of paper support

In a disk refiner, 80 weight parts of a laubholz bleached kraft pulp (LBKP) and 20 weight parts of a nadelholz bleached kraft pulp (NBKP) were beaten to give a pulp having a Canadian standard freeness of 320 cc. To the obtained pulp were added 0.5 weight part of an alkenyl succinate (KS-810, produced by Arakawa Chemical Industry, Co., Ltd.) as a neutral size, 1.0 weight part of cationic starch, 5.0 weight parts of calcium carbonate and 0.5 weight part of NaOH to obtain a paper stuff, in which the part was a dry weight ratio to the pulp. A base paper having a basis weight of 40 g/m$^2$ and a thickness of 50 μm was prepared from the obtained paper stuff using a Fourdrinier paper machine.

The obtained base paper was per se used as a paper support (b).

The pH value of the paper support (b) was 8.0.

Preparation of the light-sensitive material

A light-sensitive material (B) was prepared in the same manner as Example 1, except that the paper support (b) was used.

The pH value of the light-sensitive layer was 7.5, wherein the value was measured in the same manner as in Example 1.

COMPARISON EXAMPLE 1

Preparation of paper support

In a disk refiner, 80 weight parts of a laubholz bleached kraft pulp (LBKP) and 20 weight parts of a nadelholz bleached kraft pulp (NBKP) were beaten to give a pulp having a Canadian standard freeness of 350 cc. To the resulting pulp were added 1.0 weight part of rosin and 1.5 weight parts of aluminum sulfate to obtain a paper stuff, in which the part was a dry weight ratio to the pulp. A base paper having a basis weight of 40 g/m$^2$ and a thickness of 50 μm was prepared from the obtained paper stuff using a Fourdrinier paper machine.

The obatained base paper was per se used as a paper support (c).

The pH value of the paper support (c) was 3.8.

Preparation of light-sensitive material

A light-sensitive material (C) was prepared in the same manner as in Example 1, except that the paper support (c) was used.

The pH value of the light-sensitive layer was 7.5, wherein the value was measured in the same manner as in Example 1.

COMPARISON EXAMPLE 2

Preparation of paper support

In a disk refiner, 80 weight parts of a laubholz bleached kraft pulp (LBKP) and 20 weight parts of a nadelholz bleached kraft pulp (NBKP) were beaten to give a pulp having a Canadian standard freeness of 320 cc. To the resulting pulp were added 0.5 weight part of alkenyl succinate (KS-810, produced by Arakawa Chemical Industry, Co., Ltd.), 1.0 weight part of cationic starch and 1.5 weight parts of NaAlO$_2$ to obtain a paper stuff, in which the part was a dry weight ratio to the pulp. A base paper having a basis weight of 40 g/m$^2$ and a thickness of 50 μm was prepared from the obtained paper stuff using a Fourdrinier paper machine.

The obtained base paper was per se used as a paper support (d).

The pH value of the paper support (d) was 11.0.

Preparation of the light-sensitive material

A light-sensitive material (D) was prepared in the same manner as in Example 1, except that the paper support (d) was used.

The pH value of the light-sensitive layer was 9.5, wherein the value was measured in the same manner as in Example 1.

EXAMPLE 4

Preparation of the light-sensitive material

A light-sensitive material (E) was prepared in the same manner as in Example 1, except that the silver benzimidazole emulsion was not used.

The pH value of the light-sensitive layer was 7.1, wherein the value was measured in the same manner as in Example 1.

EXAMPLE 5

Preparation of light-sensitive material

A light-sensitive material (F) was prepared in the same manner as in Example 2, except that the silver benzotriazole emulsion was not used.

The pH value of the light-sensitive layer was 7.5, wherein the value was measured in the same manner as in Example 1.

EXAMPLE 6

Preparation of light-sensitive microcapsule

The dispersion containing light-sensitive microcapsules was prepared in the same manner as in Example 1, except that the mixture was adjusted to a pH of 6.0 using 10% sulfuric acid at the last pH-adjustment.

Preparation of light-sensitive material

The light-sensitive material (A-2) was prepared in the same manner as in Example 1, except that the above light-sensitive microcapsule dispersion was used.

The pH value of the light-sensitive layer was 6.8, wherein the value was measured in the same manner as in Example 1.

Preparation of image-receiving material

To 125 g of water was added 11 g of 40% aqueous solution of sodium hexametaphosphate, and were further added 34 g of zinc 3,5-di-α-methylbenzlsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on a cast-coated paper to give a layer having a wet thickness of 30 μm and dried to obtain an image-receiving material.

Evaluation of light-sensitive material

Each of the light-sensitive materials prepared in Examples 1 to 5 and Comparison Examples 1 & 2 was exposed to light using a tungsten lamp at 5,000 lux for 1 second through a filter in which the density is continuously changed, and then heated on a hot plate at 125° C. for 40 seconds. Each of the exposed and heated light-sensitive materials was then combined with the image-receiving material and passed through press rolls under pressure of 500 kg/cm². The density on the surface of the image-receiving material was measured by using the Macbeth's reflection densitometer.

Further, each of the prepared light-sensitive materials was left in the thermostat at 50° C. in a whole day. And then, each of the light-sensitive material was evaluated as mentioned above.

The results are set forth in Table 1. In Table 1, "Dmin" means the minimum density on the surface of the image-receiving material and "Srel" means the relative sensitivity when the sensitivity immediately after the preparation of the light-sensitive material (A-1) is 100.

TABLE 1

| Material | Paper[1] Support | pH Value Paper Support | pH Value Layer | Immediately (after preparation) Dmin | Immediately (after preparation) Srel | One day Dmin | One day Srel |
|---|---|---|---|---|---|---|---|
| (A-1) | (a) | 6.2 | 7.0 | 0.05 | 100 | 0.05 | 105 |
| (A-2) | (a) | 6.2 | 6.8 | 0.05 | 102 | 0.05 | 102 |
| (B) | (b) | 8.0 | 7.5 | 0.05 | 105 | 0.08 | 110 |
| (C) | (c) | 3.8 | 4.5 | 0.04 | 90 | 0.03 | 90 |
| (D) | (d) | 11.0 | 9.5 | 0.07 | 105 | 0.48 | 100 |
| (E) | (a) | 6.2 | 7.1 | 0.07 | 100 | 0.07 | 105 |
| (F) | (b) | 8.0 | 7.5 | 0.08 | 105 | 0.08 | 110 |

It is apparent from the results in Table 1 that each of the light-sensitive materials (A-1), (A-2), (B), (E) and (F) gives a clear image having a high sensitivity. Further, it is also apparent that each of the light-sensitive materials of the invention gives an improved positive image having a low minimum density (Dmin) even if it has been preserved under a severe condition. Furthermore, it is apparent that the similar effects can be expected, whether the silver benzotriazole emulsion is used or not.

We claim:

1. A light-sensitive material comprising a paper support and a light-sensitive layer containing silver halide grains, a reducing agent and an ethylenic unsaturated polymerizable compound, said silver halide grains and polymerizable compound being contained in microcapsules which are dispersed in the light-sensitive layer, wherein the light-sensitive layer has a pH value of not higher than 7 and the paper support has a pH value of from 5 to 9.

2. The light-sensitive material as claimed in claim 1, wherein the paper support has a pH value of from 6 to 8.5.

3. The light-sensitive material as claimed in claim 1, wherein the paper support contains a neutral internal size selected from the group consisting of a fatty acid anhydride, a rosin acid anhydride, an alkenyl-succinic anhydride, a succinamide, isopropenyl stearate, aziridine, an aziridine derivative and an alkylketene dimer.

4. The light-sensitive material as claimed in claim 1, wherein the paper support contains a fixing agent which is a neutral or weak alkaline compound selected from the group consisting of a cationic starch, polyamide-polyamine-epichlorohydrin, polyacrylamide and a polyacrylamide derivative.

5. The light-sensitive material as claimed in claim 1, wherein the reducing agent is contained in the microcapsules.

6. The light-sensitive material as claimed in claim 1, wherein the light-sensitive layer contains a base precursor which is arranged outside of the microcapsules.

7. The light-sensitive material as claimed in claim 1, wherein the light-sensitive layer contains a color image forming substance, said color image forming substance being contained in the microcapsules.

8. The light-sensitive material as claimed in claim 1, wherein the light-sensitive layer contains an organic silver salt.

* * * * *